(12) United States Patent
    Fukuda

(10) Patent No.: US 8,737,446 B2
(45) Date of Patent: May 27, 2014

(54) SEMICONDUCTOR LASER

(75) Inventor: Chie Fukuda, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 435 days.

(21) Appl. No.: 13/046,866

(22) Filed: Mar. 14, 2011

(65) Prior Publication Data

US 2011/0235667 A1   Sep. 29, 2011

(30) Foreign Application Priority Data

Mar. 25, 2010  (JP) ................................. 2010-070541

(51) Int. Cl.
    *H01S 5/00*  (2006.01)
(52) U.S. Cl.
    USPC ............... 372/50.11; 372/43.01; 372/50.1; 372/92; 372/94
(58) Field of Classification Search
    CPC ......... H01S 5/04; H01S 5/1228; H01S 5/026; H01S 5/06256; H01S 5/024; H01S 5/02415; H01S 5/0287; H01S 5/12; H01S 5/2224; H01S 3/063; H01S 3/0635; H01S 3/1055; H01S 5/1032; H01S 5/1212; H01S 5/141
    USPC ................. 372/50.11, 43.01, 50.1, 92, 94
    See application file for complete search history.

(56) References Cited

U.S. PATENT DOCUMENTS

| | | | |
|---|---|---|---|
| 4,896,325 A | 1/1990 | Coldren | |
| 6,275,317 B1 | 8/2001 | Doerr et al. | |
| 6,885,689 B2 * | 4/2005 | Margalit et al. | 372/46.01 |
| 6,940,878 B2 * | 9/2005 | Orenstein et al. | 372/20 |
| 7,424,041 B2 | 9/2008 | Meliga et al. | |
| 7,489,439 B2 * | 2/2009 | Kuo et al. | 359/334 |
| 7,773,642 B2 * | 8/2010 | Yamazaki | 372/20 |
| 7,995,635 B2 * | 8/2011 | Fukuda | 372/50.11 |
| 8,005,122 B2 * | 8/2011 | Shimizu | 372/18 |
| 8,005,123 B2 * | 8/2011 | Fukuda | 372/20 |

(Continued)

FOREIGN PATENT DOCUMENTS

| | | |
|---|---|---|
| JP | 2005-175021 | 6/2005 |
| JP | 2008-66318 | 3/2008 |

OTHER PUBLICATIONS

T. Segawa et. al., "Full C-Band Tuning Operation of Semiconductor Double-Ring Resonator-Coupled Laser With Low Tuning Current" IEEE Photonics Technology Letters, vol. 19, No. 17, Sep. 1, 2007, pp. 1322-1324.*

*Primary Examiner* — Jessica Stultz
*Assistant Examiner* — Delma R Forde
(74) *Attorney, Agent, or Firm* — Smith, Gambrell & Russell LLP

(57) ABSTRACT

A semiconductor laser includes a gain region; a distributed Bragg reflector (DBR) region including a diffraction grating; an end facet facing the DBR region with the gain region arranged therebetween; a first ring resonator including a first ring-like waveguide and a first optical coupler; a second ring resonator including a second ring-like waveguide and a second optical coupler; and an optical waveguide that is optically coupled to the end facet and extending in a predetermined optical-axis direction. The first and second ring resonators are optically coupled to the optical waveguide through the first and second optical couplers, respectively. Also, the DBR region, the gain region, and the end facet constitute a laser cavity. Further, the first ring resonator has a free spectral range different from a free spectral range of the second ring resonator.

11 Claims, 15 Drawing Sheets

(56) References Cited

U.S. PATENT DOCUMENTS

| | | | |
|---|---|---|---|
| 8,149,889 B2* | 4/2012 | Fukuda | 372/50.11 |
| 8,155,161 B2* | 4/2012 | Fukuda | 372/43.01 |
| 2003/0185256 A1 | 10/2003 | Aoki | |
| 2004/0032886 A1* | 2/2004 | Taghavi-Larigani et al. | 372/20 |
| 2004/0136412 A1 | 7/2004 | Jones | |
| 2006/0198415 A1* | 9/2006 | Yamazaki | 372/94 |
| 2006/0209911 A1* | 9/2006 | Takabayashi | 372/20 |
| 2006/0274802 A1 | 12/2006 | Aoki et al. | |
| 2008/0025358 A1* | 1/2008 | Arahira | 372/38.02 |
| 2009/0046748 A1* | 2/2009 | Kato | 372/20 |
| 2009/0092159 A1* | 4/2009 | Kato | 372/20 |
| 2009/0154505 A1* | 6/2009 | Oh et al. | 372/20 |
| 2010/0142567 A1 | 6/2010 | Ward et al. | |
| 2010/0245831 A1* | 9/2010 | Okamoto | 356/451 |
| 2010/0246612 A1* | 9/2010 | Shimizu | 372/18 |
| 2010/0296539 A1* | 11/2010 | Fukuda et al. | 372/45.01 |
| 2011/0235659 A1* | 9/2011 | Fukuda | 372/20 |

* cited by examiner

SEMICONDUCTOR LASER

BACKGROUND OF THE INVENTION

1. Field of the Invention

The present invention relates to a semiconductor laser.

2. Description of the Related Art

Japanese Unexamined Patent Application Publication No. 2008-066318 discloses a wavelength tunable semiconductor laser. This wavelength tunable semiconductor laser includes a plurality of ring resonators having mutually different free spectral ranges (FSRs), and a gain region optically coupled to the plurality of ring resonators. More specifically, both ends of the gain region are respectively optically coupled to input ports of the individual ring resonators. Output ports of the ring resonators are optically coupled to a light emission end facet. The wavelength tunable semiconductor laser described in Japanese Unexamined Patent Application Publication No. 2008-066318 performs wavelength tuning by using vernier effect provided by the plurality of ring resonators having the mutually different FSRs.

SUMMARY OF THE INVENTION

However, to perform the wavelength tuning by using the vernier effect, one ring resonator has a larger value of the FSR than that of other ring resonators. Hence, the optical path length of an optical waveguide of the ring resonator with a large FSR is decreased. As the result, the bend radius of the optical waveguide of the ring resonator with the large FSR becomes small, resulting in an increase in bending loss and an increase in optical loss of that ring resonator.

A semiconductor laser according to an aspect of the present invention includes a gain region; a distributed Bragg reflector (DBR) region including a diffraction grating; an end facet facing the distributed Bragg reflector region with the gain region arranged therebetween; a first ring resonator including a first ring-like waveguide and a first optical coupler; a second ring resonator including a second ring-like waveguide and a second optical coupler; and an optical waveguide that is optically coupled to the end facet and extending in a predetermined optical-axis direction. The first ring resonator is optically coupled to the optical waveguide through the first optical coupler. The second ring resonator is optically coupled to the optical waveguide through the second optical coupler. Also, the distributed Bragg reflector region, the gain region, and the end facet constitute a laser cavity. Furthermore, the first ring resonator has a free spectral range different from a free spectral range of the second ring resonator.

In the semiconductor laser, the first optical coupler may have a first input port and a first output port, the first output port including a through port and a cross port. The second optical coupler may have a second input port and a second output port, second output port including a through port and a cross port. The optical waveguide may be coupled to the first input port and the through port of the first output port. The optical waveguide may be coupled to the second input port and the through port of the second output port. Also, the first and second ring resonators may be connected to each other in series through the optical waveguide.

In the semiconductor laser, the first and second ring resonators are optically coupled to the optical waveguide extending from a first end facet in the predetermined optical-axis direction through the first and second optical couplers, respectively. Also, the DBR region, the gain region, and the end facet which are coupled to the optical waveguide constitute the laser cavity. Herein, the DBR region including a diffraction grating functions as one reflection mirror of the laser cavity, and the end facet functions as the other reflection mirror. Light emitted in the gain region propagates through the optical waveguide in the laser cavity while being amplified, is reflected at the DBR region and the end facet, and again propagates in the optical waveguide in the laser cavity. Thus, laser oscillation can be obtained.

The optical waveguide may be coupled to the first optical coupler such that the optical waveguide is coupled to the first input port and the through port of the first output port of the first optical coupler. Similarly, the optical waveguide may be coupled to the second optical coupler such that the optical waveguide is coupled to the second input port and the through port of the second output port of the second optical coupler. A bending loss of the ring-like waveguide portion of a ring resonator increases as bend radii R decreases. However, with this configuration, reduction of the optical intensities of light output from the ring resonators due to the bending losses of the first and second ring-like waveguide can be restricted. With the semiconductor laser according to the aspect of the present invention, even if ring resonators have smaller bend radii R, the relatively large optical intensity of light output from the ring resonators may be obtained. On the other hand, by using the ring resonators with small bend radii R, the FSRs of the ring resonators can be increased. Thus, the ring resonators with small bend radii R can be used so that the FSRs of the ring resonators are increased. Furthermore, large optical outputs coupled from the ring resonators to the optical waveguide through the optical couplers are obtained.

Also, in the semiconductor laser, the first and second ring resonators having the different FSRs may be connected to each other in series through the optical waveguide. Hence, the wavelength-transmittance characteristics of these ring resonators are superposed on each other, and a wavelength-transmittance characteristic with a sharper peak waveform can be obtained. Accordingly, laser light of a single wavelength with a narrower emission wavelength width can be obtained.

In the semiconductor laser, the first and second optical couplers may each have a splitting ratio of smaller than 1, where the splitting ratio of the optical coupler is a ratio of an optical intensity at the through port to an optical intensity at the cross port. In this case, an optical output at the cross port is larger than an optical output at the through port of each of the first and second optical couplers. Accordingly, the peaks and bottoms in the wavelength-transmittance characteristics of the first and second ring resonators can be formed in good shapes.

Also, in the semiconductor laser, the first ring-like waveguide of the first ring resonator may be coupled to the cross port of the first output port, and the second ring-like waveguide of the second ring resonator may be coupled to the cross port of the second output port.

In the semiconductor laser, the FSR of the first ring resonator may be two or more times larger than the FSR of the second ring resonator. More preferably, the FSR of the first ring resonator may be 2n times larger than the FSR of the second ring resonator when n is a natural number. Accordingly, the wavelength-transmittance characteristics of the first and second ring resonators can be properly superposed on each other, and a sharp peak waveform can be obtained. In particular, the first ring resonator may have a transmittance peak wavelengths $\lambda p_1$ and the second ring resonator may have a transmittance peak $\lambda p_2$ that is provided at a wavelength interval of 2n times the FSR of the second ring resonator. A difference $|\lambda p_1 - \lambda p_2|$ between $\lambda p_1$ and $\lambda p_2$ may be ½ or smaller of the FSR of the second ring resonator. Accordingly, the peaks in the wavelength-transmittance characteristics of the first and second ring resonators are effectively superposed on each other, and a sharper peak waveform can be obtained.

In the semiconductor laser, the first and second optical couplers may be multimode interference couplers.

Preferably, the semiconductor laser may further include a phase adjustment region that is arranged between the DBR region and the end facet and adjusts an optical length of the optical waveguide. Also, the diffraction grating in the DBR region may be a chirp diffraction grating in which a period of the diffraction grating changes along the predetermined optical-axis direction. Further, the DBR region may include a plurality of electrodes. Further, a high reflection (HR) film may be formed on the end facet.

DESCRIPTION OF THE PREFERRED EMBODIMENT

A semiconductor laser according to an embodiment of the present invention will be described in detail below with reference to the attached drawings. It is to be noted that like reference signs refer like elements when the description is given for the drawings, and redundant description is omitted.

Figure 1:
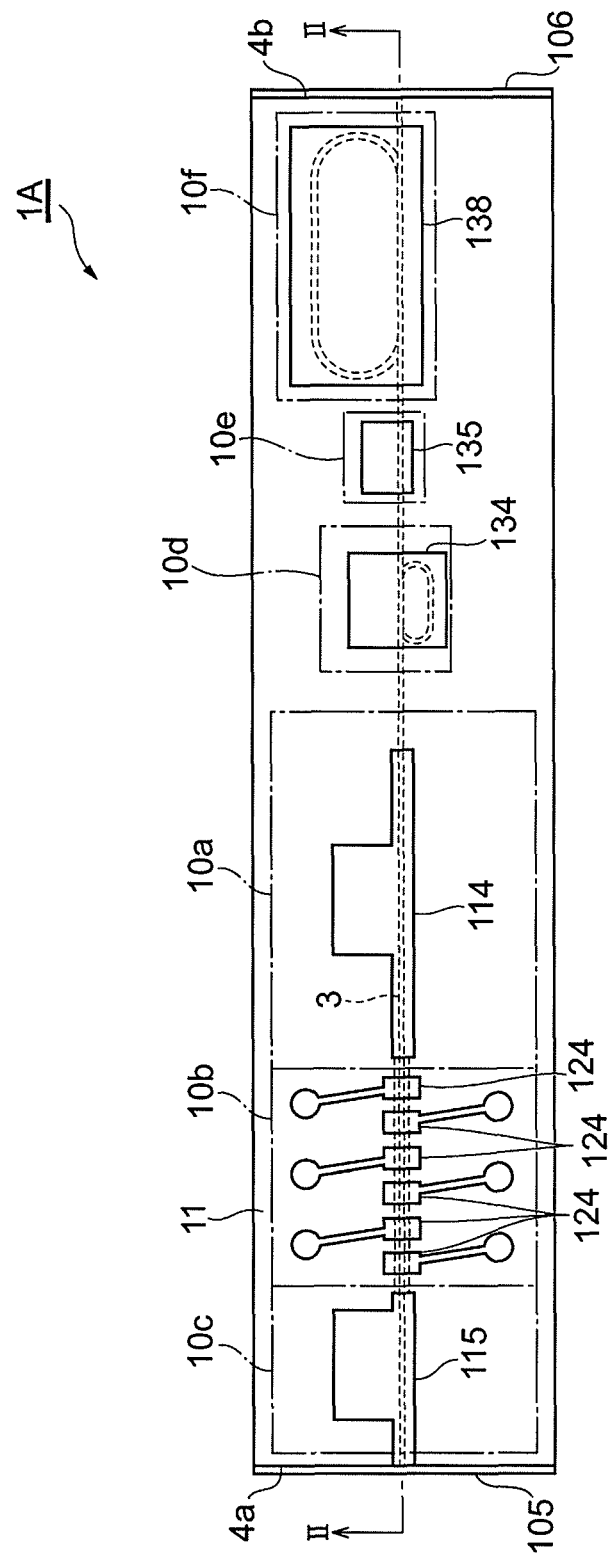
FIG. 1 is a plan view of a semiconductor laser according to an embodiment of the present invention.
Figure 2:
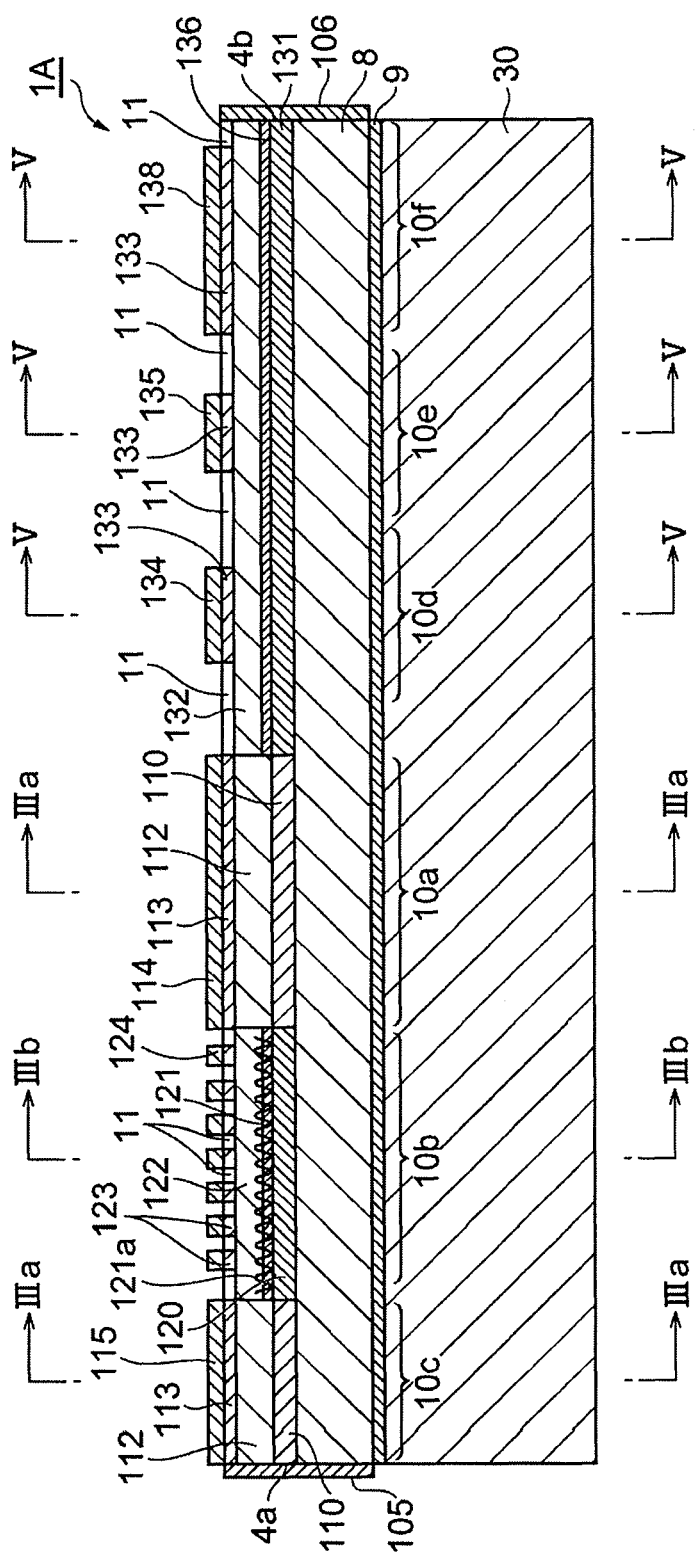
FIG. 2 is a cross-sectional view taken along line II-II of the semiconductor laser shown in FIG. 1.

FIG. 1 is a plan view of a semiconductor laser 1A according to the embodiment of the present invention. FIG. 2 is a cross-sectional view taken along line II-II of the semiconductor laser 1A shown in FIG. 1. The semiconductor laser 1A is a wavelength tunable semiconductor laser.

Referring to FIGS. 1 and 2, the semiconductor laser 1A includes a gain region 10a, a distributed Bragg reflector (DBR) region 10b, an amplifier region 10c, a first ring resonator region 10d, a phase adjustment region (phase adjustment portion) 10e, and a second ring resonator region 10f. These regions 10a to 10f are formed on a common semiconductor substrate 8 as shown in FIG. 2, and arranged in a predetermined optical waveguide direction. The arrangement order of the regions 10a to 10f is not particularly limited, and may be changed in various ways instead of the order shown in FIG. 1. The semiconductor laser 1A also includes an optical waveguide 3 extending straight from a first end facet 4a to a second end facet 4b in the optical waveguide direction that is a predetermined optical-axis direction according to this embodiment. The semiconductor laser 1A has a length of, for example, about 1500 μm in the optical waveguide direction.

The semiconductor substrate 8 is made of, for example, n-type indium phosphide (InP), and functions as a lower clad in the semiconductor laser 1A. The semiconductor substrate 8 is mounted on a cooling device 30 through a cathode electrode 9 provided on the back surface of the semiconductor substrate 8. The cooling device 30 maintains the temperature of the semiconductor substrate 8 and a layer structure on the principal surface of the semiconductor substrate 8 constant. The cooling device 30 may include, for example, a Peltier device.

Figure 3A:
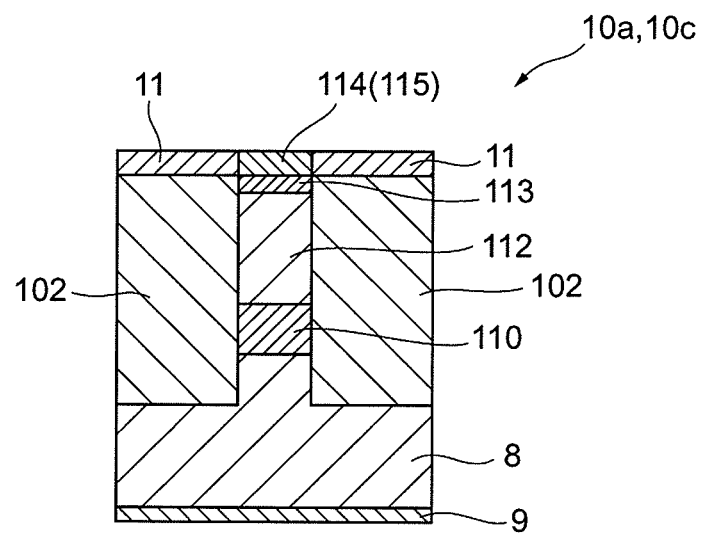
FIG. 3A is a cross-sectional view taken along line IIIa-IIIc of the semiconductor laser shown in FIG. 2, FIG. 3A showing structures of a gain region and an amplifier region.
Figure 3B:
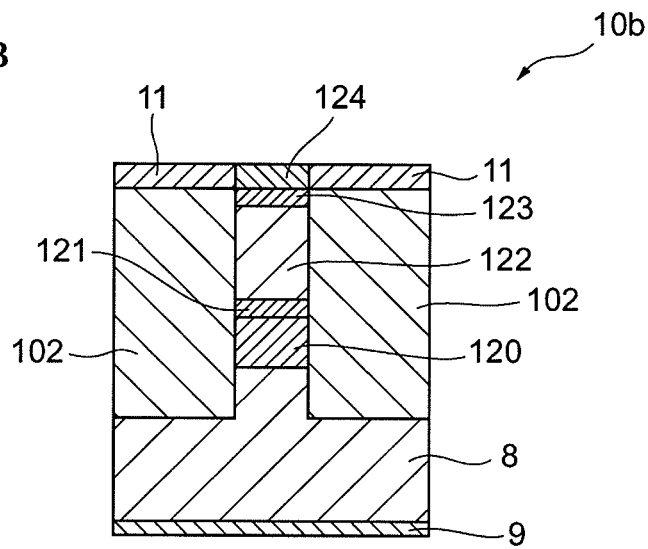
FIG. 3B is a cross-sectional view taken along line IIIb-IIIb of the semiconductor laser shown in FIG. 2, FIG. 3B showing a structure of a distributed Bragg reflector (DBR) region.

FIG. 3A is a cross-sectional view taken along line IIIa-IIIa of the semiconductor laser 1A shown in FIG. 2. FIG. 3A illustrates structures of the gain region 10a and the amplifier region 10c. FIG. 3B is a cross-sectional view taken along line IIIb-IIIb of the semiconductor laser 1A shown in FIG. 2. FIG. 3B illustrates the structure of the DBR region 10b. In FIGS. 3A and 3B, the illustration of the cooling device 30 (FIG. 2) is omitted.

Referring to FIGS. 2 and 3A, the gain region 10a and the amplifier region 10c each include an optical waveguide layer 110 provided on the semiconductor substrate 8, an upper cladding layer 112 provided on the optical waveguide layer 110, and a contact layer 113 provided on the upper cladding layer 112. The optical waveguide layer 110 constitutes part of the optical waveguide 3 shown in FIG. 1. In particular, the optical waveguide layer 110 in the gain region 10a corresponds to a gain waveguide in this embodiment. The optical waveguide layer 110 is formed of a semiconductor having a larger band gap wavelength (i.e., having a smaller band gap energy) than a semiconductor of the semiconductor substrate 8. The optical waveguide layer 110 extends in the optical waveguide direction along the principal surface of the semiconductor substrate 8. The optical waveguide layer 110 includes, for example, a lower optical confinement layer provided on the semiconductor substrate 8, an active layer provided on the lower optical confinement layer, and an upper optical confinement layer provided on the active layer.

Figure 4A:
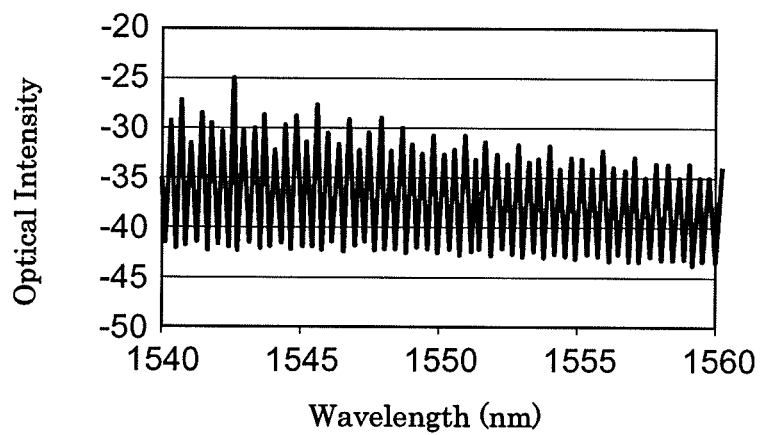
FIG. 4A is a graph showing an example of an emission spectrum of the gain region.

According to the embodiment, the lower and upper optical confinement layers are made of undoped gallium indium arsenide phosphide (GaInAsP), and the active layer has a multi quantum well (MQW) structure of GaInAsP. The composition of the active layer is adjusted to generate (or amplify) light with a wavelength in a range from 1.52 to 1.57 µm. FIG. 4A is a graph showing an example of an emission spectrum of the gain region 10a. In FIG. 4A, the vertical axis plots an optical intensity and the horizontal axis plots a wavelength. Referring to FIG. 4A, the gain region 10a generates light having a relatively wide-band emission spectrum. The optical waveguide layer 110 has a thickness of, for example, 0.3 µm.

The upper cladding layer 112 is made of p-type InP, and the contact layer 113 is made of p-type gallium indium arsenide (GaInAs). The upper cladding layer 112 and the contact layer 113 respectively have thicknesses of, for example, 2 µm and 0.2 µm.

The optical waveguide layer 110, the upper cladding layer 112, and the contact layer 113 have a stripe-shaped mesa structure extending in a predetermined optical waveguide direction on the semiconductor substrate 8 (see FIG. 3A). The stripe-shaped mesa structure has a width of, for example, 1.5 µm in a direction intersecting with the optical waveguide direction. Also, a semi-insulating region 102 is provided on either of both side surfaces of the stripe-shaped mesa structure. The semi-insulating region 102 is made of a semi-insulating (high-resistance) semiconductor. For example, the semi-insulating semiconductor may be iron (Fe)-doped InP.

An anode electrode 114 is provided on the contact layer 113 in the gain region 10a. An anode electrode 115 is provided on the contact layer 113 in the amplifier region 10c. The anode electrodes 114 and 115 are ohmic electrodes made of, for example, titanium (Ti)/platinum (Pt)/gold (Au). Also, the cathode electrode 9 is provided on the back surface of the semiconductor substrate 8. The cathode electrode 9 is an ohmic electrode made of, for example gold germanium (AuGe). Current is injected into the optical waveguide layers 110 through the anode electrodes 114 and 115 and the cathode electrode 9. The regions on the upper surfaces of the gain region 10a and the amplifier region 10c not occupied by the anode electrodes 114 or 115 are protected by an insulating film 11 made of, for example, silicon dioxide (SiO$_2$). The insulating film 11 has a thickness of, for example, 0.35 µm.

Referring to FIGS. 1 and 2, an anti reflection (AR) film 105 is provided on an end facet of the amplifier region 10c in the optical waveguide direction (i.e., the first end facet 4a of the semiconductor laser 1A). The AR film 105 has a reflectivity of, for example, 0.1%.

Referring to FIGS. 2 and 3B, the DBR region 10b is provided at a first end side of the optical waveguide layer 110 in the gain region 10a. The DBR region 10b has a reflection spectrum having a predetermined reflection band which is determined by the period of the diffraction grating 121a. The DBR region 10b includes an optical waveguide layer 120 provided on the semiconductor substrate 8, a diffraction grating layer 121 provided on the optical waveguide layer 120, an upper cladding layer 122 provided on the diffraction grating layer 121, and a contact layer 123 provided on the upper cladding layer 122. The optical waveguide layer 120 constitutes part of the optical waveguide 3 shown in FIG. 1. The optical waveguide layer 120 has a smaller band gap wavelength than a band gap wavelength of the active layer in the gain region 10a. For example, the band gap wavelength of the optical waveguide layer 120 is 1.3 µm or smaller. The refractive index of the optical waveguide layer 120 changes in accordance with the magnitude of current that is injected into the optical waveguide layer 120 through the cathode electrode 9 and an anode electrode 124. The optical waveguide layer 120 is formed of a semiconductor having a larger band gap wavelength than that of the semiconductor substrate 8. The optical waveguide layer 120 extends in the optical waveguide direction along the principal surface of the semiconductor substrate 8. Also, a first end of the optical waveguide layer 120 is coupled to the optical waveguide layer 110 in the gain region 10a, and a second end thereof is coupled to the optical waveguide layer 110 in the amplifier region 10c.

The diffraction grating layer 121 is provided along the optical waveguide layer 120. In this embodiment, the diffraction grating layer 121 is provided directly above the optical waveguide layer 120. To effectively confine light around the optical waveguide layer 120, the band gap wavelength of the diffraction grating layer 121 is preferably smaller than the band gap wavelength of the optical waveguide layer 120, and is, for example, 1.2 µm.

A diffraction grating 121a (see FIG. 2) having periodic projections and recesses is formed at the interface between the diffraction grating layer 121 and the upper cladding layer 122. The diffraction grating 121a is provided along the optical waveguide layer 120. The diffraction grating 121a is a chirp diffraction grating in which the period of the diffraction grating changes in the optical waveguide direction of the optical waveguide layer 120. The chirp diffraction grating has a wider reflection band than that of the conventional diffraction grating having a constant period.

According to the embodiment, the optical waveguide layer 120 and the diffraction grating layer 121 are made of undoped GaInAsP, and respectively have thicknesses of, for example, 0.3 µm and 50 nm. The upper cladding layer 122 is made of p-type InP, and the contact layer 123 is made of p-type GaInAs. The upper cladding layer 122 and the contact layer 123 respectively have thicknesses of for example, 2 µm and 0.2 µm.

The optical waveguide layer 120, the upper cladding layer 122, and the contact layer 123 have a stripe-shaped mesa structure extending in the predetermined optical waveguide direction on the semiconductor substrate 8 like the optical waveguide layers 110 in the gain region 10a and the amplifier region 10c (see FIG. 3B). The width of the stripe-shaped mesa structure in the direction intersecting with the optical waveguide direction is similar to that of the stripe-shaped mesa structure in each of the gain region 10a and the amplifier region 10c. The both side surfaces of the stripe-shaped mesa structure are embedded by the semi-insulating region 102 that is commonly used for the gain region 10a and the amplifier region 10c.

A plurality of anode electrodes 124 are provided on the contact layer 123. The plurality of anode electrodes 124 are arranged on the contact layer 123 in the optical waveguide direction with predetermined gaps interposed therebetween. The plurality of anode electrodes 124 are electrically isolated from each other. The plurality of anode electrodes 124 are ohmic electrodes made of, for example, Ti/Pt/Au. Current is injected into part of the optical waveguide layer 120 through one of the anode electrodes 124 and the cathode electrode 9 provided on the back surface of the semiconductor substrate 8. The regions on the upper surface of the DBR region 10b not occupied by the plurality of anode electrodes 124 are protected by the insulating film 11 that is commonly used for the gain region 10a and the amplifier region 10c.

Figure 4B:
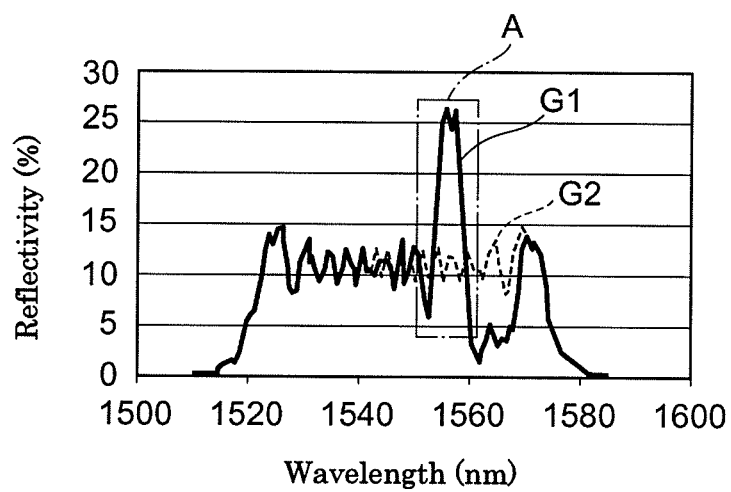
FIG. 4B is a graph showing an example of a reflection spectrum of the DBR region when current is supplied to an optical waveguide layer and a diffraction grating layer from one of a plurality of anode electrodes.

A graph section G1 in FIG. 4B shows an example of a reflection spectrum of the DBR region 10b when current is supplied to the optical waveguide layer 120 and the diffraction grating layer 121 from one of the plurality of anode electrodes 124. In FIG. 4B, the vertical axis plots a reflectivity, and the horizontal axis plots a wavelength. A graph section G2 indicated by a broken line in FIG. 4B shows a case in which no current is supplied to the plurality of anode electrodes 124.

When current is supplied to one of the plurality of anode electrodes 124, the refractive indices of the part of the optical waveguide layer 120 and diffraction grating layer 121 located below the anode electrode 124 supplied with current become small. Thus, the reflectivity peak wavelength of the diffraction grating changes to the short-wavelength side in accordance with the magnitude of current injected into the optical waveguide layer 120 and diffraction grating layer 121. In contrast, the reflectivity of the diffraction grating 121a does not change in the other portion where the refractive index does not change. Hence, referring to FIG. 4B, in the reflection spectrum of the DBR region 10b, the reflectivity in the wavelength region (portion A in the drawing) corresponding to the period of the diffraction grating 121a located below the anode electrode 124 supplied with current is selectively increased. In this embodiment, current can be applied individually to the plurality of anode electrodes 124. By applying current to one of the anode electrodes 124, the reflectivity in the wavelength region corresponding to the period of diffraction grating located below this anode electrode 124 supplied with current can be increased. As the result, the laser emission wavelength can be tuned within this wavelength region in which the reflectivity is increased. It is to be noted that the number of anode electrodes 124 to which current is simultaneously supplied is not limited to one, and current may be supplied to two or more of the anode electrodes 124.

Figure 5:
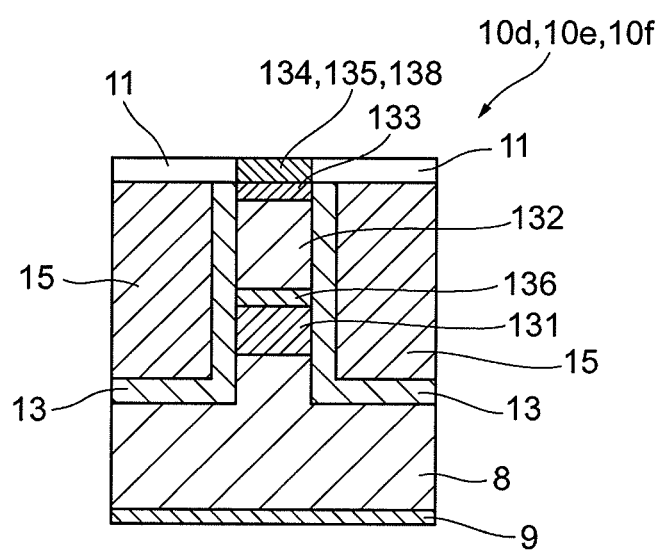
FIG. 5 is a cross-sectional view taken along line V-V of the semiconductor laser, FIG. 5 showing structures of first and second ring resonator regions and a phase adjustment region.

Next, with reference to FIGS. 1, 2, and 5, configurations of the first ring resonator region 10d, the phase adjustment region 10e, and the second ring resonator region 10f in the semiconductor laser 1A will be described. FIG. 5 is a cross-sectional view taken along line V-V of the semiconductor laser 1A. FIG. 5 illustrates a structure that is common to the first and second ring resonator regions 10d and 10f and the phase adjustment region 10e. In FIG. 5, the illustration of the cooling device 30 (FIG. 2) is omitted.

The first and second ring resonator regions 10d and 10f are provided in series at a second end side of the optical waveguide layer 110 in the gain region 10a. The first and second ring resonator regions 10d and 10f have transmittance spectra that periodically change with respect to wavelengths. The phase adjustment region 10e is a region for controlling the optical path length of the optical waveguide 3. The phase adjustment region 10e is arranged between the first and second ring resonator regions 10d and 10f.

Referring to FIG. 5, the first and second ring resonator regions 10d and 10f and the phase adjustment region 10e each include an optical waveguide layer 131, an upper cladding layer 132, and a contact layer 133 that are stacked on the semiconductor substrate 8 in that order. Further, the first and second ring resonator regions 10d and 10f respectively include anode electrodes 134 and 138. The phase adjustment region 10e includes an anode electrode 135. It is to be noted that the cathode electrode 9 provided on the back surface of the semiconductor substrate 8 is also used as a cathode electrode for the first and second ring resonator regions 10d and 10f and the phase adjustment region 10e. Also, a semiconductor layer 136, which has a composition similar to that of the diffraction grating layer 121 in the DBR region 10b, is provided between the optical waveguide layer 131 and the upper cladding layer 132. The interface between the semiconductor layer 136 and the upper cladding layer 132 is flat. No diffraction grating is formed at the interface between the semiconductor layer 136 and the upper cladding layer 132.

The optical waveguide layers 131 are provided above the principal surface of the semiconductor substrate 8, and serve as optical waveguides in the first and second ring resonator regions 10d and 10f and the phase adjustment region 10e. Further, the optical waveguide layers 131 constitute part of the optical waveguide 3 of the semiconductor laser 1A. One end of the optical waveguide layer 131 in the first ring resonator region 10d is optically coupled to the optical waveguide layer 110 in the gain region 10a. One end of the optical waveguide layer 131 in the phase adjustment region 10e is optically coupled to a second end of the optical waveguide layer 131 in the first ring resonator region 10d. One end of the optical waveguide layer 131 in the second ring resonator region 10f is optically coupled to the second end of the optical waveguide layer 131 in the phase adjustment region 10e. The refractive index of the optical waveguide layers 131 changes in accordance with the magnitude of current injected into the optical waveguide layers 131 through the cathode electrode 9 and the anode electrode 134, 135, or 138.

Referring to FIGS. 1 and 2, a high reflection (HR) film 106 is provided on an end facet of the second ring resonator region 10f in the optical waveguide direction (i.e., the second end facet 4b of the semiconductor laser 1A). The HR film 106 has a reflectivity of, for example, 90% or higher. The second end of the optical waveguide layer 131 in the second ring resonator region 10f is optically coupled to the HR film 106.

According to the embodiment, the optical waveguide layers 131 and the semiconductor layer 136 are made of undoped GaInAsP, and respectively have thicknesses of, for example, 0.3 µm and 50 nm. The optical waveguide layers 131 have a smaller band gap wavelength than a band gap wavelength of the active layer in the gain region 10a. For example, the band gap wavelength of the optical waveguide layers 131 is 1.3 µm or smaller. The upper cladding layer 132 is made of p-type InP, and the contact layer 133 is made of p-type GaInAs. The upper cladding layer 132 and the contact layer 133 respectively have thicknesses of, for example, 2 µm and 0.2 µm.

The optical waveguide layer 131, the upper cladding layer 132, and the contact layer 133 form a mesa structure. The upper surface and both side surfaces of the mesa structure are covered with an insulating film 13 made of, for example, $SiO_2$. Openings are formed in the insulating film 13 at the upper surface of the mesa structure to form an ohmic contact between the contact layer 133 and the anode electrodes 134, 135, and 138. The insulating film 13 is also provided on the principal surface of the semiconductor substrate 8. The insulating film 13 has a thickness of, for example, 0.35 µm.

Further, a resin layer 15 is provided on the insulating film 13 to extend along both side surfaces of the mesa structure.

The resin layer 15 is made of, for example, benzocyclobutene (BCB) resin, and has a thickness, for example, in a range from 1 to 2 μm.

The anode electrodes 134, 135, and 138 are provided on the contact layers 133. The anode electrodes 134, 135, and 138 are ohmic electrodes made of, for example, gold zinc (AuZn). The anode electrodes 134, 135, and 138 are electrically isolated from each other. Currents are injected into the respective optical waveguide layers 131 in the first ring resonator region 10d, the phase adjustment region 10e, and the second ring resonator region 10f through the cathode electrode 9 and the anode electrodes 134, 135, and 138. The regions on the upper surface of the resin layer 15 and the mesa structure not occupied by the anode electrode 134, 135, or 138 is protected by the insulating film 11 that is common to the gain region 10a, the DBR region 10b, and the amplifier region 10c.

Current is injected into the optical waveguide layer 131 in the phase adjustment region 10e through the cathode electrode 9 and the anode electrode 135. The refractive index of the optical waveguide layer 131 in the phase adjustment region 10e changes in accordance with the magnitude of the injected current. By changing the refractive index of the optical waveguide layer 131, the optical path length of the phase adjustment region 10e is changed. As the result, the resonator length of the entire optical waveguide 3 in the semiconductor laser 1A changes. Accordingly, by adjusting the amount of current injected into the optical waveguide layer 131 in the phase adjustment region 10e, the emission wavelength (longitudinal mode) of the semiconductor laser 1A can be adjusted.

Figure 6:
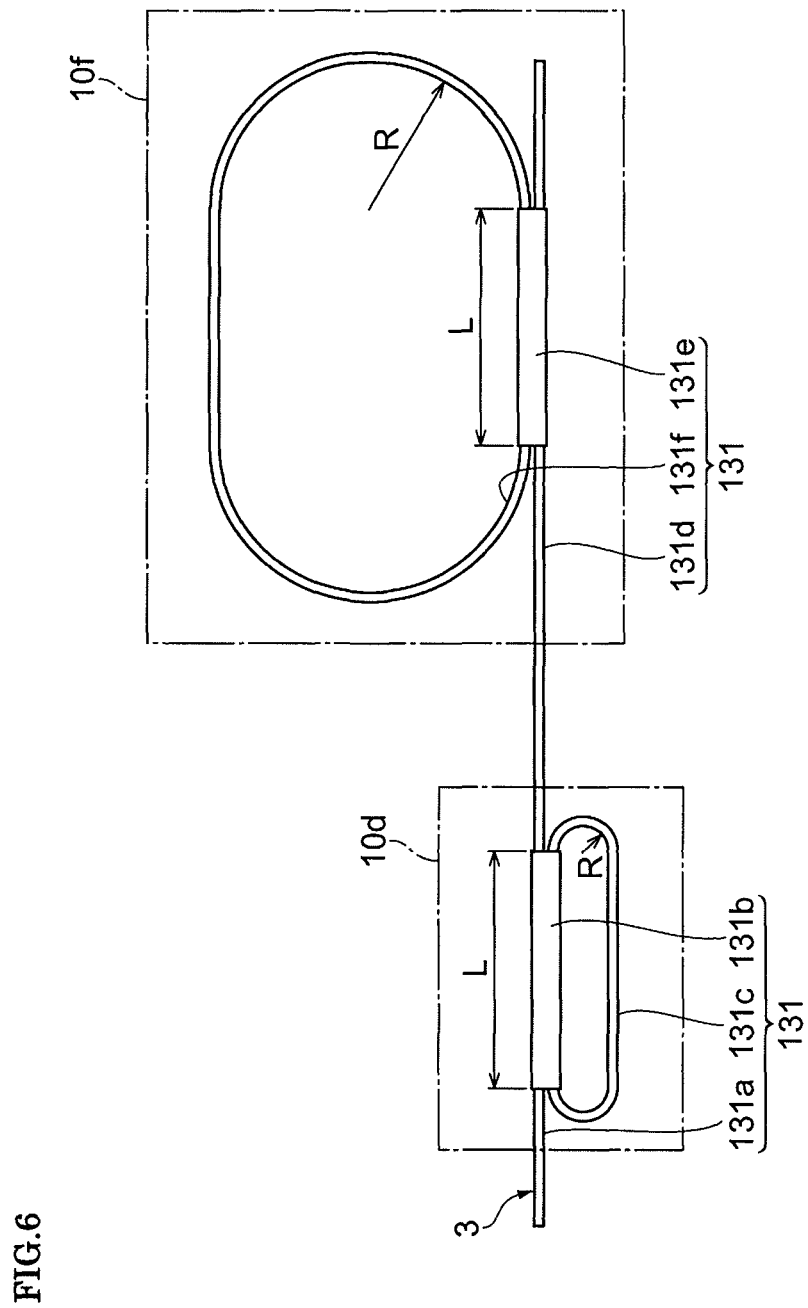
FIG. 6 illustrates in an enlarged manner plan outlines of optical waveguide layers in the first and second ring resonator regions.

FIG. 6 illustrates in an enlarged manner plan outlines of the optical waveguide layers 131 in the first and second ring resonator regions 10d and 10f. The optical waveguide layer 131 in the first ring resonator region 10d includes a straight waveguide portion 131a that constitutes part of the optical waveguide 3, an optical coupler 131b, and a ring-like waveguide portion (first ring-like waveguide) 131c that is coupled to the waveguide portion 131a through the optical coupler 131b. Similarly, the optical waveguide layer 131 in the second ring resonator region 10f includes a straight waveguide portion 131d that constitutes part of the optical waveguide 3, an optical coupler 131e, and a ring-like waveguide portion (second ring-like waveguide) 131f that is coupled to the waveguide portion 131d through the optical coupler 131e. The optical couplers 131b and 131e are, for example, 2×2 multimode interference (MMI) couplers. The optical couplers 131b and 131e have two input ports and two output ports, respectively. Each of the output ports of the optical coupler 131b and 131e includes a through port and a cross port corresponding to the input port.

As described above, the ring resonators in the first and second ring resonator regions 10d and 10f are formed by coupling the ring-like waveguide portions 131c and 131f to part of the optical waveguide 3, which extends from the first end facet 4a to the second end facet 4b of the semiconductor laser 1A, through the optical couplers 131b and 131e, respectively. In this embodiment, light is emitted from the first end facet 4a of the semiconductor laser 1A. To increase the optical output from the first end facet 4a, a high reflection film is formed on the second end facet 4b. In the semiconductor laser 1A, the optical waveguide 3 is coupled to the input port and the through port of each output port of the optical couplers 131b and 131e. Each of the ring-like waveguide portions 131c and 131f is coupled to the cross port of each output port of the optical couplers 131b and 131e as shown in FIG. 6. Thus, light output from each ring resonator is coupled to the optical waveguide 3 through the optical coupler, and propagates through the optical waveguide 3. In particular, in the semiconductor laser 1A according to this embodiment, the respective ring resonators in the first and second ring resonator regions 10d and 10f are connected to each other in series through the optical waveguide 3. The transmission spectra of the respective ring resonators periodically change at a predetermined repetition period (free spectral range, FSR), and have discrete transmittance peak wavelengths.

Also, the optical path length per single round of the ring-like waveguide portion 131c in the first ring resonator region 10d is different from the optical path length per single round of the ring-like waveguide portion 131f in the second ring resonator region 10f. Accordingly, the predetermined repetition period (FSR) of the wavelength-transmittance characteristic of the ring resonator in the first ring resonator region 10d is different from the predetermined repetition period (FSR) of the wavelength-transmittance characteristic of the ring resonator in the second ring resonator region 10f. In this embodiment, referring to FIG. 6, the optical path length of the ring-like waveguide portion 131c is smaller than the optical path length of the ring-like waveguide portion 131f. Accordingly, the FSR of the ring resonator in the first ring resonator region 10d is larger than the FSR of the ring resonator in the second ring resonator region 10f.

Also, the transmittance peak wavelengths of the respective ring resonators in the first and second ring resonator regions 10d and 10f shift in accordance with the magnitude of current that is injected into the optical waveguide layers 131 through the cathode electrode 9 and the anode electrodes 134 and 138.

Figure 7:
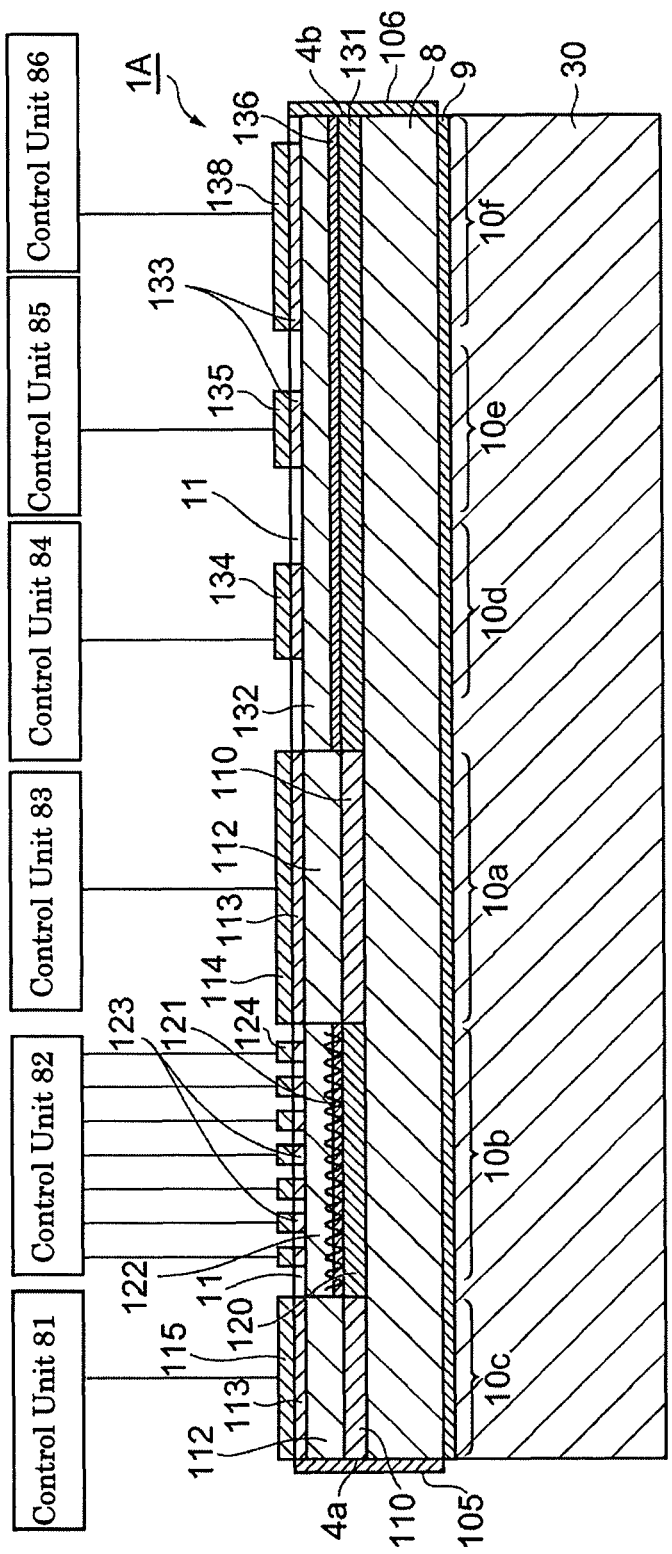
FIG. 7 illustrates a control unit configuration for operating the semiconductor laser.

The operation of the semiconductor laser 1A having the above-described configuration will be described. FIG. 7 illustrates a control unit configuration for operating the semiconductor laser 1A. Referring to FIG. 7, the semiconductor laser 1A is driven by control units 81 to 86.

The control unit 81 is a circuit that supplies current between the anode electrode 115 and the cathode electrode 9 in the amplifier region 10c and adjusts the amount of current to obtain a predetermined optical output power. The control unit 82 selects one or two or more of the plurality of anode electrodes 124, and supplies current between the selected anode electrode(s) 124 and the cathode electrode 9, to increase the reflectivity of a predetermined wavelength region and to adjust the laser emission wavelength within that wavelength region. The control unit 83 supplies current to the gain waveguide through the anode electrode 114 and the cathode electrode 9 in the gain region 10a and generates light. The control unit 84 connected to the first ring resonator region 10d supplies current between the anode electrode 134 and the cathode electrode 9 and adjusts the amount of current, to shift the transmittance peak wavelength of the ring resonator in the first ring resonator region 10d to a predetermined wavelength. Similarly, the control unit 86 connected to the second ring resonator region 10f supplies current between the anode electrode 138 and the cathode electrode 9 and adjusts the amount of current, to shift the transmittance peak wavelength of the ring resonator in the second ring resonator region 10f to a predetermined wavelength. The control unit 85 supplies current between the anode electrode 135 and the cathode electrode 9 and adjusts the amount of current, to change the optical path length of the phase adjustment region 10e and to adjust the emission wavelength (longitudinal mode) of the semiconductor laser 1A. The magnitudes of the current supplied from the units 81 to 86 may be set in advance to obtain a predetermined emission wavelength of light emitted from the semiconductor laser 1A.

When the current is supplied to the gain region 10a, light is generated in the gain waveguide (the optical waveguide layer 110 in the gain region 10a). The light is guided through the optical waveguide 3, and propagates in a laser cavity constituted by the second end facet 4b, the gain region 10a, and the DBR region 10b. Laser light can be emitted by injecting current of more than a threshold current to the gain region 10a. Part of the laser light passes through the DBR region 10b, is amplified to obtain a desirable intensity in the amplifier region 10c, and then is output to the outside from the end facet 4a through the AR film 105.

Figure 8A:
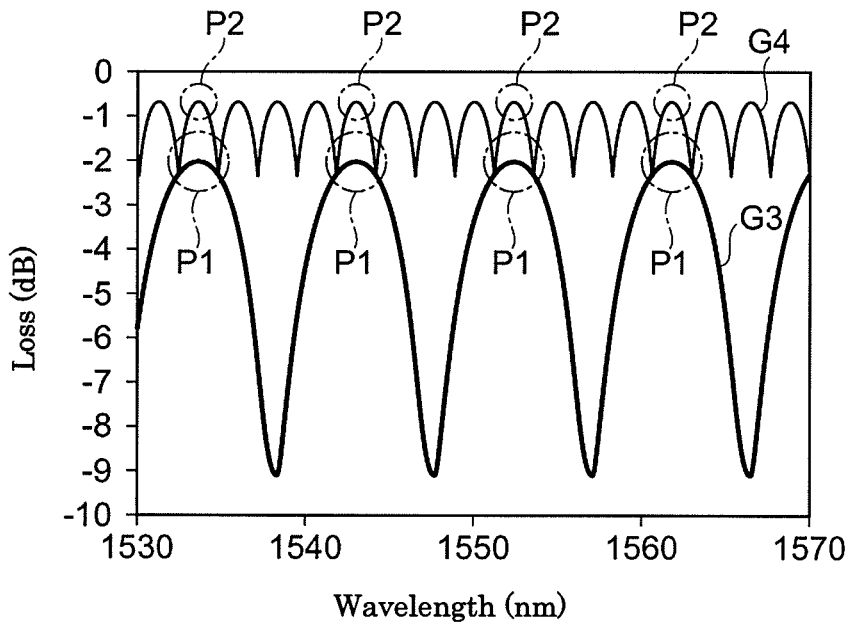
FIG. 8A is a graph showing an example of transmission spectra of ring resonators provided respectively in the first and second ring resonator regions.

FIG. 8A is a graph showing an example of transmission spectra of the ring resonators provided respectively in the first and second ring resonator regions 10d and 10f. In FIG. 8A, a graph section G3 shows a transmission spectrum of the first ring resonator region 10d and a graph section G4 shows a transmission spectrum of the second ring resonator region 10f. In FIG. 8A, the vertical axis plots an optical loss (optical transmittance) and the horizontal axis plots a wavelength. Table I shows a splitting ratio (through-port optical intensity: cross-port optical intensity) of each of the optical couplers 131b and 131e in the first and second ring resonator regions 10d and 10f, a coupling length (length L in FIG. 6), a bend radius (radius R in FIG. 6), a normalized optical power reduction ratio per single round of a ring, a refractive index of the optical waveguide layer 131, an FSR, and initial current for obtaining the transmission spectra in FIG. 8A. The normalized optical power reduction ratio is defined as the optical power ratio between the after and before propagating into the waveguide of the ring resonator which is equal to 1 for the ring resonator having the waveguide without transmission loss. Therefore, maximum value of the normalized optical power reduction ratio is equal to 1, and the normalized optical power reduction ratio tends to decrease for the ring resonator having a small radius.

TABLE I

Structures of the first and second ring resonators.

|  | First ring resonator | Second ring resonator |
| --- | --- | --- |
| Splitting ratio of optical coupler | 0.12:0.85 | 0.12:0.85 |
| Coupling length, L (μm) | 20 | 20 |
| Radius, R (μm) | 5 | 39.5 |
| Normalized optical power reduction ratio | 0.8 | 0.95 |
| Refractive index | 3.57 | 3.54 |
| FSR (GHz) | 1186 | 295 |
| Initial current, $I_0$ (mA) | 0 | 58.66 |

In this embodiment, the light from each ring resonator is output to the optical waveguide that is coupled to the through port of the optical coupler. Hence, referring to FIG. 8A, a half-width of a peak waveform in a wavelength-transmittance characteristic of each ring resonator becomes relatively large.

Also, the FSR of the ring resonator in the first ring resonator region 10d is larger than the FSR of the ring resonator in the second ring resonator region 10f as mentioned above. In the example shown in FIG. 8A, the FSR of the first ring resonator region 10d (graph section G3) is four times larger than the FSR of the second ring resonator region 10f (graph section G4). In this embodiment, since the ring resonators are arranged in series in the optical waveguide 3, the transmission spectrum for light through the first ring resonator region 10d and the second ring resonator region 10f is a combined transmission spectrum between the transmission spectra (graph sections G3 and G4) of the first and second resonator regions 10d and 10f.

Figure 8B:
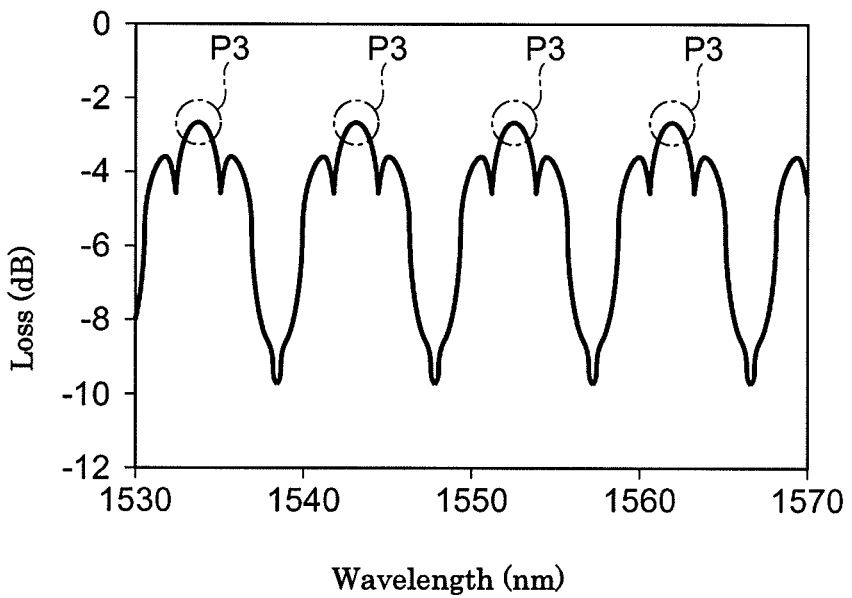
FIG. 8B is a graph showing a combined transmission spectrum.

FIG. 8B shows the combined transmission spectrum. In FIG. 8B, the vertical axis plots an optical loss (optical transmittance) and the horizontal axis plots a wavelength. Referring to FIG. 8B, in the combined transmission spectrum, a transmittance peak waveform (part P1 shown in FIG. 8A) in the transmission spectrum of the first ring resonator region 10d is superposed on a transmittance peak waveform (part P2 shown in FIG. 8A) in the transmission spectrum of the second ring resonator region 10f. Thus, a transmittance peak waveform P3 is formed. The transmittance peak waveform P3 has the same FSR as the FSR of the transmittance peak waveform P1 of the first ring resonator region 10d (graph section G3 in FIG. 8A). The transmittance peak waveform P3 has substantially the same full width at half maximum (FWHM) as the FWHM of the transmittance peak waveform P2 of the second ring resonator region 10f (graph section G4 in FIG. 8A).

As described above, in the semiconductor laser 1A of this embodiment, since the ring resonators having the mutually different FSRs are provided in series, the transmission spectra of the ring resonators are superposed on each other and the transmission spectrum having the larger FSR and the sharper peak waveform P3 can be obtained. Accordingly, laser light having a single wavelength and a narrower emission band width can be obtained.

Figure 9A:
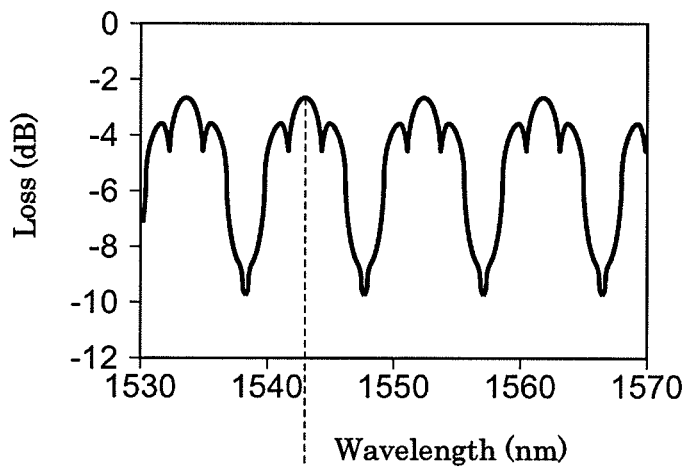
FIG. 9A illustrates the combined transmission spectrum provided by the first and second ring resonator regions.
Figure 9B:
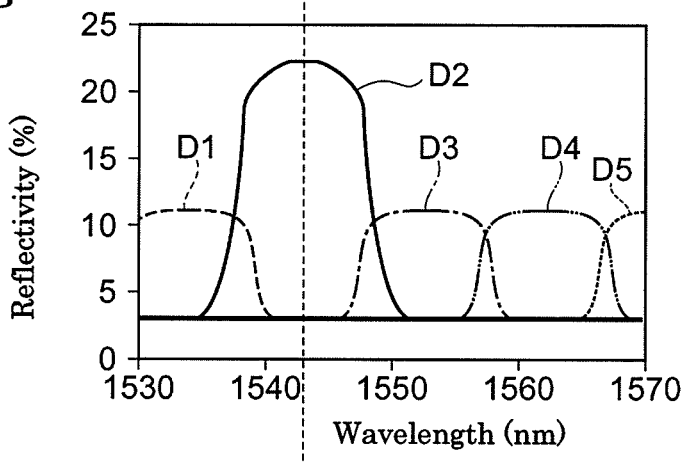
FIG. 9B illustrates a wavelength-reflectivity characteristic of the DBR region.
Figure 9C:
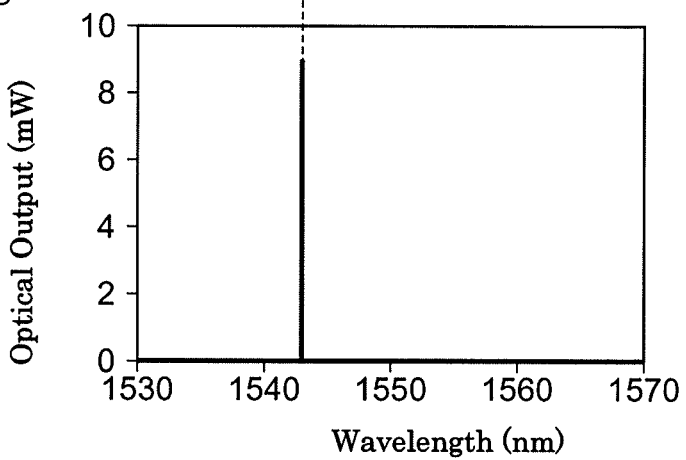
FIG. 9C illustrates a lasing spectrum of the semiconductor laser having the combined transmission spectrum provided by the first and second ring resonator regions shown in FIG. 9A and the wavelength-reflectivity characteristic of the DBR region shown in FIG. 9B.

FIGS. 9A, 9B, and 9C are illustrations for explaining the principle that light with a predetermined wavelength selectively propagates in the optical waveguide 3 in the laser cavity. FIG. 9A shows the combined transmission spectrum which is the transmission spectrum combined the transmission spectra of the first and second ring resonator regions 10d and 10f. FIG. 9A is the same graph as the aforementioned graph in FIG. 8B. FIG. 9B shows a wavelength-reflectivity characteristic of the DBR region 10b. In FIG. 9B, waveforms D1 to D5 respectively indicate reflectivities for reflection wavelength regions of the chirp diffraction grating 121a (see FIG. 2) that is located directly below the anode electrodes 124. For example, FIG. 9B indicates the reflectivities of the DBR region 10b when current is supplied to the anode electrode 124 that is provided in a region with reflection wavelengths ranging from 1538 to 1548 nm in the chirp diffraction grating 121a.

Light having a wavelength which corresponds to the transmittance peak wavelength of the combined transmission spectrum shown in FIG. 9A is only guided through the optical waveguide 3. Furthermore, light having a wavelength within the wavelength region with the high reflectivity shown in FIG. 9B is only guided through the optical waveguide 3. Accordingly, only light having a wavelength overlapping between the transmittance peak wavelength in FIG. 9A and the high-reflectivity wavelength region (waveform D2) in FIG. 9B selectively propagates in the laser cavity and is emitted from the semiconductor laser 1A as shown in FIG. 9C.

Also, as described above, the transmittance peak wavelengths of the respective ring resonators in the first and second ring resonator regions 10d and 10f shift in accordance with current that is supplied to the anode electrodes 134 and 138. Equations 1 and 2 are for calculation of current $I_1$ that is supplied to the anode electrode 134 in the first ring resonator region 10d, and current $I_2$ that is supplied to the anode electrode 138 in the second ring resonator region 10f. Equations 1 and 2 are as follows:

$$I_1 = I_{01} + \Delta I_d \times \text{(length of ring-like waveguide portion } 131c) \times \text{(waveguide width)} \quad (1),\text{ and}$$

$$I_2 = I_{02} + \Delta I_d \times \text{(length of ring-like waveguide portion } 131f) \times \text{(waveguide width)} \quad (2),$$

where $I_{01}$ and $I_{02}$ are initial current values respectively supplied to the anode electrodes 134 and 138, and $\Delta I_d$ is current per unit area necessary for shifting the transmittance peak wavelength of the ring resonator.

Figure 10:
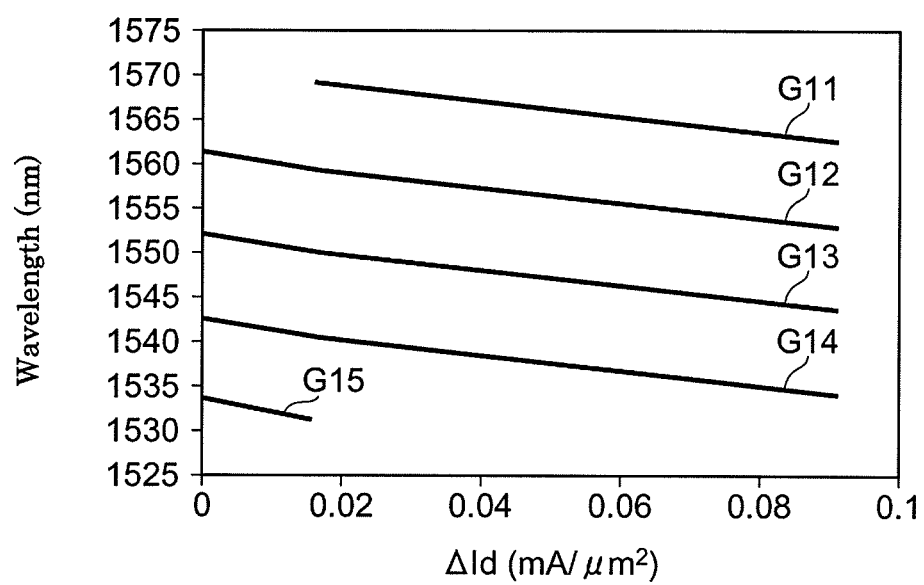
FIG. 10 illustrates an example of a graph showing the relationship between a transmittance peak wavelength and $\Delta I_d$ of Eqs. 1 and 2.

The relationship between $\Delta I_d$ and the transmittance peak wavelength can be obtained in advance by using ring resonators that are made of a material and have a structure similar to the material and structure of the ring resonators of this embodiments. FIG. 10 illustrates an example of a graph showing the relationship between the transmittance peak wavelength and the $\Delta I_d$ of Eqs. 1 and 2. Referring to FIG. 10, graph sections G11 to G15 indicate transmittance peak wavelengths of mutually different transmittance waveforms P3 (see FIG. 8B). As shown in Eqs. 1 and 2, if the $\Delta I_d$ is the same value for the current $I_1$ and the current $I_2$, the transmittance peak waveforms P1 and P2 shown in FIG. 8A can be shifted while the positional relationship between the transmittance peak waveforms P1 and P2 is maintained. Accordingly, the transmittance peak wavelengths having the transmittance peak waveforms P3 can be shifted as shown in FIG. 10. Thus, in the semiconductor laser 1A of this embodiment, the wavelength tunable laser can be realized without the vernier effect which is used for the conventional tunable lasers.

Figure 11A:
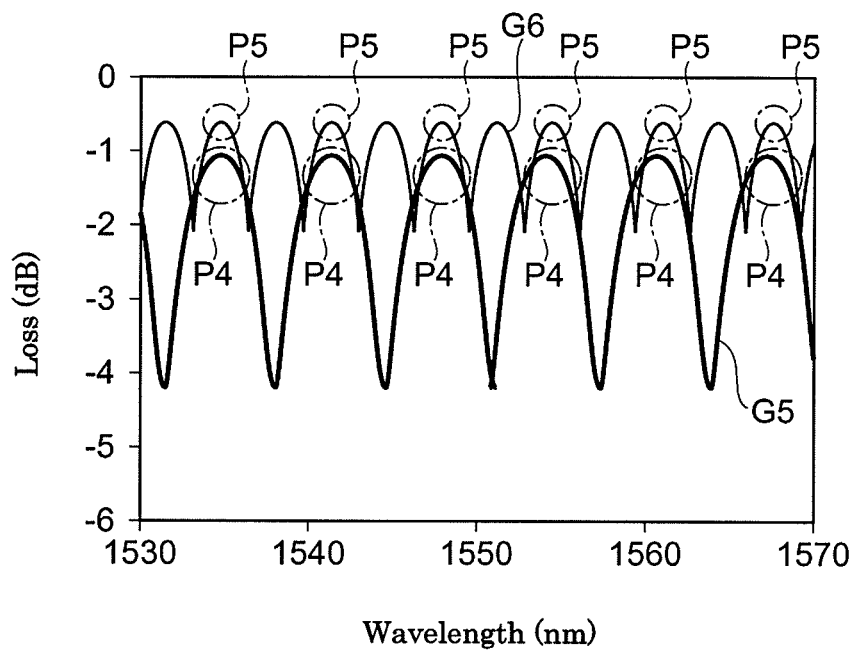
FIG. 11A is a graph showing another example of transmission spectra of the ring resonators provided respectively in the first and second ring resonator regions.

FIG. 11A is a graph showing another example of transmission spectra of the ring resonators provided respectively in the first and second ring resonator regions 10d and 10f. In FIG. 11A, a graph section G5 shows a transmission spectrum of the first ring resonator region 10d and a graph section G6 shows a transmission spectrum of the second ring resonator region 10f. Table II shows a splitting ratio (through-port optical intensity: cross-port optical intensity) of each of the optical couplers 131b and 131e in the first and second ring resonator regions 10d and 10f, a coupling length (length L in FIG. 6), a bend radius (radius R in FIG. 6), an optical power reduction ratio per single round of a ring, a refractive index of the optical waveguide layer 131, and an FSR for obtaining the transmission spectra in FIG. 11A.

TABLE II

Structures of the first and second ring resonators.

| | First ring resonator | Second ring resonator |
|---|---|---|
| Splitting ratio of optical coupler | 0.12:0.85 | 0.12:0.85 |
| Coupling length, L (μm) | 20 | 20 |
| Radius, R (μm) | 10 | 26.5 |
| Normalized optical power reduction ratio | 0.9 | 0.95 |
| Refractive index | 3.57 | 3.569 |
| FSR (GHz) | 624 | 409 |

In this example, the FSR of the first ring resonator region 10d (graph section G5) is two times larger than the FSR of the second ring resonator region 10f (graph section G6). These transmission spectrum characteristics are combined. The transmission spectrum for light through the first ring resonator region 10d and the second ring resonator region 10f is a combined transmission spectrum between the transmission spectra (graph sections G5 and G6) of the first and second resonator regions 10d and 10f.

Figure 11B:
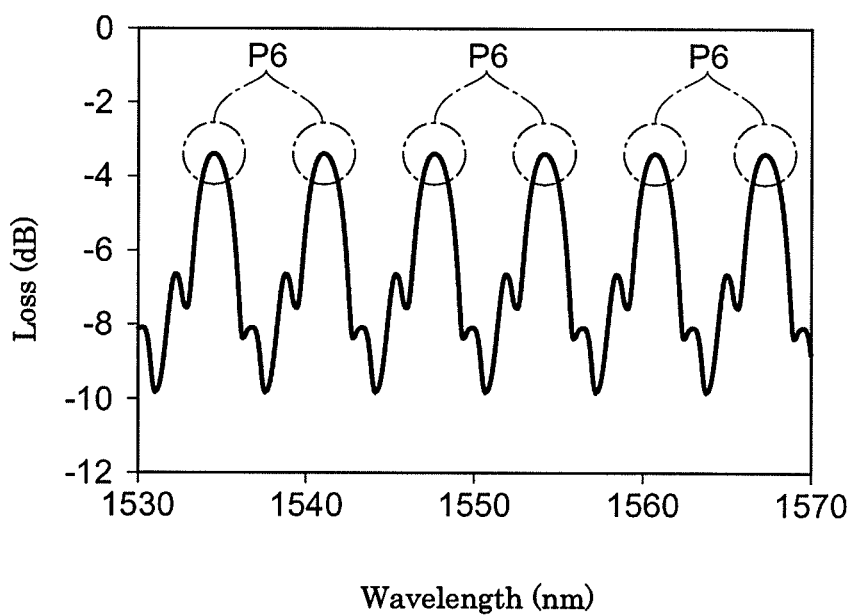
FIG. 11B is a graph showing a combined transmission spectrum.

FIG. 11B shows the combined transmission spectrum. Referring to FIG. 11B, in the combined transmission spectrum, a transmittance peak waveform (part P4 shown in FIG. 11A) in the transmission spectrum of the first ring resonator region 10d is superposed on a transmittance peak waveform (part P5 shown in FIG. 11A) in the transmission spectrum of the second ring resonator region 10f. Thus, a transmittance peak waveform P6 is formed. The transmittance peak waveform P6 has the same FSR as the FSR of the transmittance peak waveform P4 of the first ring resonator region 10d (graph section G5 in FIG. 11A). The transmittance peak waveform P6 has substantially the same full width at half maximum (FWHM) as the FWHM of the transmittance peak waveform P5 of the second ring resonator region 10f (graph section G6 in FIG. 11A).

Now, the transmission spectrum characteristics of the respective ring resonators in the first and second ring resonator regions 10d and 10f will be further discussed. In this embodiment, as shown in FIGS. 8A and 11A, the transmittance peak waveforms P1 and P4 of the first ring resonator region 10d are respectively superposed on the transmittance peak waveforms P2 and P5 of the second ring resonator region 10f. Accordingly, the shaper transmittance peak waveforms P3 and P6 with narrower FWHMs are formed as shown in FIGS. 8B and 11B. To achieve this relationship for the transmittance peak waveforms of the first and second ring resonator regions 10d and 10f, preferably, the FSR (hereinafter, referred to as $\lambda_1$) of the first ring resonator region 10d may be two or more times larger than the FSR (hereinafter, referred to as $\lambda_2$) of the second ring resonator region 10f. Also, more preferably, $\lambda_1$ may be 2n (n is natural number) times larger than $\lambda_2$. For example, $\lambda_1$ is four times (i.e., n=2) larger than $\lambda_2$ in the example shown in FIG. 8A, and $\lambda_1$ is two times (i.e., n=1) larger than $\lambda_2$ in the example shown in FIG. 11A.

Wavelength $\lambda.p_1$ is defined as a peak wavelength in the transmission spectra of the ring resonator in the first ring resonator region 10d, and wavelength $\lambda.p_2$ is defined as a peak wavelength in the transmission spectra of the ring resonator in the second ring resonator region 10f. When the wavelength $\lambda.p_2$ is provided at an interval of a wavelength ($\lambda_2 \times 2n$), the difference $|\lambda.p_1 - \lambda.p_2|$ between $\lambda.p_1$ and $\lambda.p_2$ is preferably $\lambda_2/2$ or smaller. In this case, the transmittance peak waveforms of the first and second ring resonator regions 10d and 10f is effectively superposed on each other. In other words, the difference between a center wavelength of a transmittance peak waveform (corresponding to the transmittance peak waveforms P2 and P5 in the aforementioned examples) that appears every 2n waveforms from among a plurality of transmittance peak waveforms included in the transmission spectrum of the second ring resonator region 10f, and a center wavelength of a transmittance peak waveform (corresponding to the transmittance peak waveforms of P1 and P4 in the aforementioned examples) included in the transmission spectrum of the first ring resonator region 10d is preferably ½ or smaller of the FSR of the second ring resonator region 10f.

Next, a splitting ratio of each of the optical couplers 131b and 131e (see FIG. 6) provided in the first and second ring resonator regions 10d and 10f will be discussed. The optical couplers 131b and 131e have two output ports, respectively. One output port is a cross port and the other is a through port. When light enters into the optical couplers 131b and 131e from the straight waveguide portions 131a and 131d, the output port coupled to the ring-like waveguide portions 131c or 131f is the cross port. On the other hand, the output port coupled to the straight waveguide portions 131a or 131d is the through port. A splitting ratio of an optical coupler is defined as a ratio of an optical intensity at the through port to an optical intensity at the cross port (hereinafter, the ratio is referred to as a splitting ratio of an optical coupler or is referred to as through-port optical intensity: cross-port optical intensity).

Figure 12A:
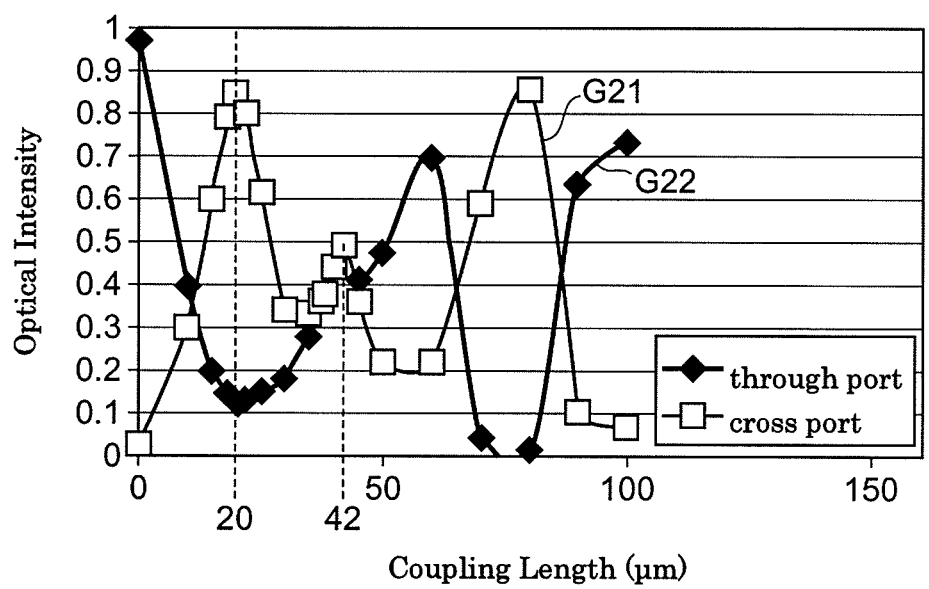
FIG. 12A is a graph showing the relationship between a coupling length L of an optical coupler and normalized optical intensities of a cross port and a through port.
Figure 12B:
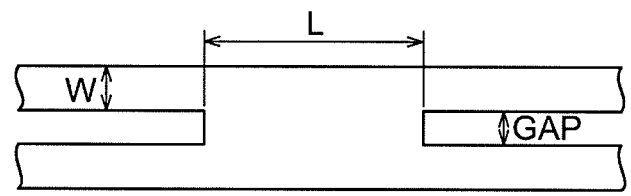
FIG. 12B illustrates a model of the optical coupler for obtaining the relationship between a coupling length L of an optical coupler and normalized optical intensities of a cross port and a through port shown in FIG. 12A.

FIG. 12A is a graph showing the relationship between the coupling length L of each of the optical couplers 131b and 131e, which are MMI optical couplers, and the normalized optical intensities at the cross port and the through port of the optical coupler. The normalized optical intensities of the vertical axis indicate optical intensities at the cross ports and the through ports normalized by all optical intensities of light input to the optical coupler. In FIG. 12A, a graph section G21 indicates the normalized optical intensity of the cross port, and a graph section G22 indicates the normalized optical intensity of the through port. FIG. 12B illustrates a model of an optical coupler for obtaining the relationship between the coupling length L of each of the optical couplers 131b and 131e and the normalized optical intensities of the cross port and the through port of the optical coupler shown in FIG. 12A. In this embodiment, a gap GAP is determined as GAP=0.5 μm, and a waveguide width W is determined as W=1.2 μm.

Referring to FIG. 12A, in each of the optical couplers 131b and 131e, the splitting ratio of the optical coupler can be changed by changing the coupling length L. For example, if the coupling length L is 20 μm, the splitting ratio of the optical coupler (through-port optical intensity: cross-port optical intensity) is 0.12:0.85 when the splitting ratio is expressed as a ratio of the normalized optical intensity at the through port to the normalized optical intensity at the cross port. Hereinafter, the splitting ratio of the optical coupler is expressed as the ratio of the normalized optical intensity at the through port to the normalized optical intensity at the cross port similarly. For example, when the coupling length L is 42 μm, the splitting ratio of the optical coupler is 0.49:0.49. For example, the transmission spectrum shown in FIG. 8A is provided when the splitting ratio of the optical coupler is 0.12:0.85 and the coupling length L is 20 μm. In this case, the good combined transmission spectrum characteristic can be obtained as shown in FIG. 8B.

Figure 13:
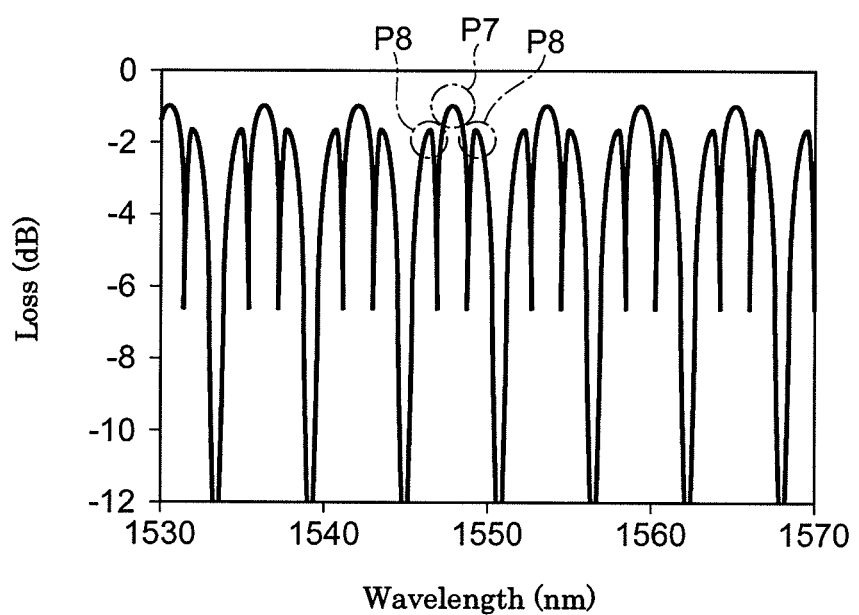
FIG. 13 is a graph showing a combined transmission spectrum when a splitting ratio (through-port optical intensity: cross-port optical intensity) of the optical coupler is 0.49: 0.49.

FIG. 13 is a graph showing a combined transmission spectrum when the splitting ratio of the optical coupler is 0.49: 0.49. Table III shows a splitting ratio of each of the optical couplers in the first and second ring resonator regions 10d and 10f, a coupling length L, a bend radius R, an optical power reduction ratio per single round of a ring, a refractive index of the optical waveguide layer 131, and an FSR for obtaining the combined transmission spectrum in FIG. 13.

TABLE III

Structures of the first and second ring resonators.

|  | First ring resonator | Second ring resonator |
| --- | --- | --- |
| Splitting ratio of optical coupler | 0.49:0.49 | 0.49:0.49 |
| Coupling length, L (μm) | 42 | 42 |
| Radius, R (μm) | 5 | 42 |
| Normalized optical power reduction ratio | 0.8 | 0.95 |
| Refractive index | 3.57 | 3.56 |
| FSR (GHz) | 728 | 243 |

Figure 14:
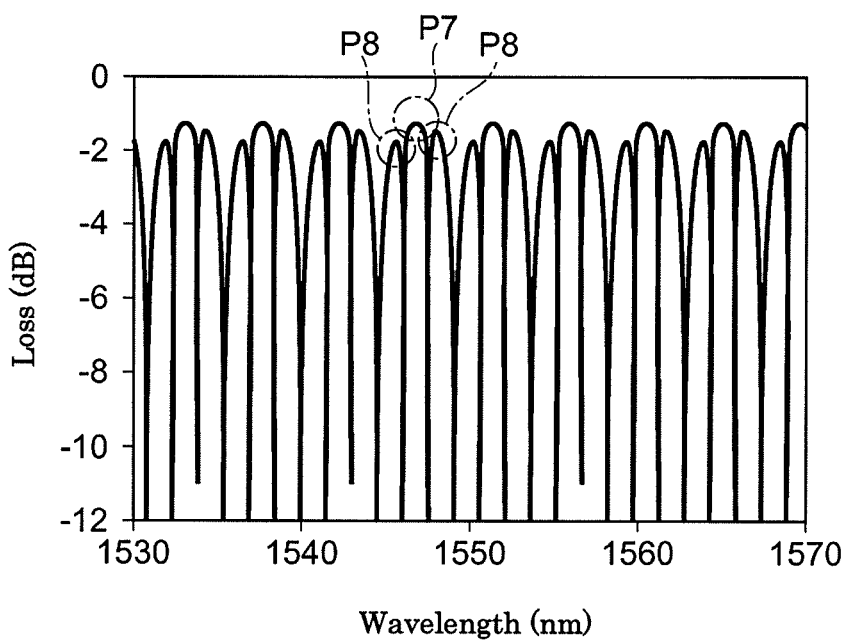
FIG. 14 is a graph showing a combined transmission spectrum when a splitting ratio (through-port optical intensity: cross-port optical intensity) of the optical coupler is 0.7:0.2.

FIG. 14 is a graph showing a combined transmission spectrum when the splitting ratio of the optical coupler is 0.7:0.2. Table IV shows a splitting ratio of each of the optical couplers in the first and second ring resonator regions 10d and 10f, a coupling length L, a bend radius R, an optical power reduction ratio per single round of a ring, a refractive index of the optical waveguide layer 131, and an FSR for obtaining the combined transmission spectrum in FIG. 14.

TABLE IV

Structures of the first and second ring resonators.

|  | First ring resonator | Second ring resonator |
| --- | --- | --- |
| Splitting ratio of optical coupler | 0.7:0.2 | 0.7:0.2 |
| Coupling length, L (μm) | 58 | 58 |
| Radius, R (μm) | 5 | 52 |
| Normalized optical power reduction ratio | 0.8 | 0.95 |
| Refractive index | 3.57 | 3.564 |
| FSR (GHz) | 573 | 186 |

Referring to FIGS. 13 and 14, in a case of a splitting ratio in which the optical intensity at the through port is substantially equivalent to or larger than the optical intensity at the cross port, a main transmittance peak waveform (main peak waveform) P7 is close to a transmittance peak waveform (sub-peak waveform) P8 that is located around the main peak waveform P7 and has a lower transmittance than that of the main peak waveform P7 in the combined transmission spectrum. The difference of the transmittances between the main peak P7 and the sub-peak P8 is not sufficiently provided. In order to cause the laser emission wavelength to correctly match with the center wavelength (transmittance peak wavelength) of the main peak waveform and to suppress the optical intensity of the sub-peak, the difference between transmittances of the main peak P7 and the sub-peak P8 is preferably enlarged. Therefore, the splitting ratio is preferably determined such that the optical intensity at the cross port becomes larger than the optical intensity at the through port. The splitting ratio of the optical couplers 131b and 131e is preferably smaller than 1, where the splitting ratio of the optical coupler is a ratio of the optical intensity at the through port to the optical intensity at the cross port.

If the optical couplers 131b and 131e are the MMI optical couplers like this embodiment, the coupling length L is changed to change the splitting ratio of the optical coupler as shown in FIG. 12A. By the way, the FSR of the ring resonator region also changes according to change of the coupling length L. When the splitting ratio is determined such that the optical intensity of the through port of the optical coupler in the first ring resonator region 10d is increased and the optical intensity of the cross port is decreased by increasing the coupling length L, the FSR of the first ring resonator region 10d becomes small. For example, the FSR of the first ring resonator region 10d is 573 GHz in the case of the splitting ratio of 0.7:0.2 and the coupling length L of 58 μm as shown in table IV. On the other hand, the FSR of the first ring resonator region 10d is 1186 GHz in the case of the splitting ratio of 0.12:0.85 and the coupling length L of 20 μm as shown in table I. And the FSR of the first ring resonator region 10d is 728 GHz in the case of the splitting ratio of 0.49:0.49 and the coupling length L of 42 μm as shown in table III. When the FSR of the first ring resonator region 10d is small, a unit of the reflection wavelength band of the diffraction grating 121a in the DBR region 10b has to be decreased to overlap the reflection wavelength band to the transmittance peak wavelength of the combined transmission spectrum. To be more specific, the length of each of the anode electrodes 124 has to be decreased, and the number of anode electrodes has to be increased.

Figure 15:
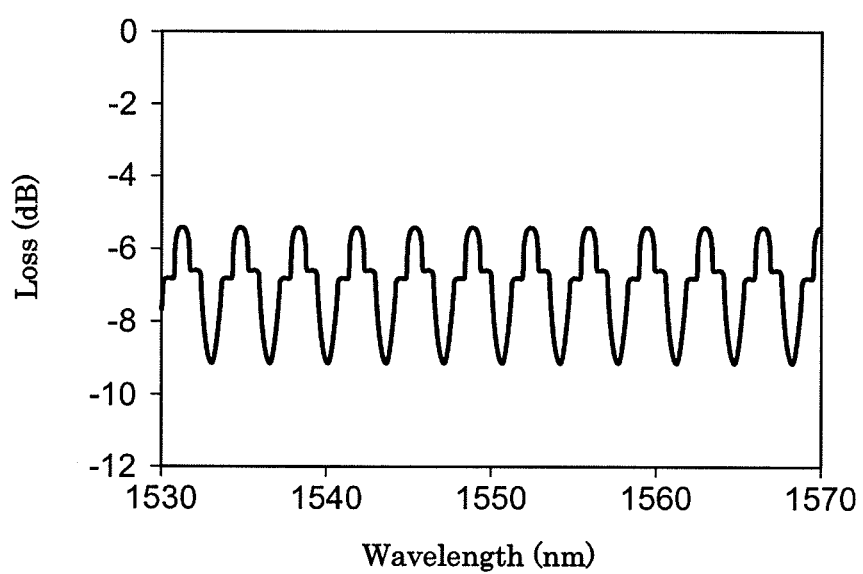
FIG. 15 is a graph showing a combined transmission spectrum when the through-port optical intensity is markedly smaller than the cross-port optical intensity such as when a splitting ratio (through-port optical intensity: cross-port optical intensity) of the optical coupler is 0.02:0.86.

FIG. 15 is a graph showing a combined transmission spectrum when the splitting ratio of the optical coupler is determined such that the optical intensity of the through port of the optical coupler becomes markedly smaller than the optical intensity of the cross port. To be more specific, the splitting ratio of the optical coupler in FIG. 15 is 0.02:0.86 and the coupling length L is 80 µm. Table V shows a splitting ratio of each of the optical couplers in the first and second ring resonator regions 10*d* and 10*f*, a coupling length L, a bend radius R, an optical power reduction ratio per single round of a ring, a refractive index of the optical waveguide layer 131, and an FSR for obtaining the combined transmission spectrum in FIG. 15.

TABLE IV

Structures of the first and second ring resonators.

|  | First ring resonator | Second ring resonator |
| --- | --- | --- |
| Splitting ratio of optical coupler | 0.02:0.86 | 0.02:0.86 |
| Coupling length, L (µm) | 80 | 80 |
| Radius, R (µm) | 5 | 66 |
| Normalized optical power reduction ratio | 0.8 | 0.95 |
| Refractive index | 3.57 | 3.5685 |
| FSR (GHz) | 434 | 147 |

To increase the difference between transmittances of the main peak and the sub-peak, the splitting ratio is preferably determined such that the optical intensity at the cross port becomes larger than the optical intensity at the through port as mentioned above. However, when the optical intensity at the through port is markedly smaller than the optical intensity at the cross port, the peak transmittance in the transmittance peak wavelength becomes small as shown in FIG. 15. This is because the waveguide loss of the optical waveguide has to be increased so that the optical intensity at the through port becomes markedly smaller than the optical intensity at the cross port. Therefore, under this condition, the laser emission threshold is increased, and the laser characteristic is degraded. Owing to this, the normalized optical intensity at the through port is preferably 0.1 or larger (see FIG. 12A).

In this semiconductor laser 1A, the respective ring resonators in the first and second ring resonator regions 10*d* and 10*f* are formed by coupling the ring-like waveguide portions 131*c* and 131*f* to the waveguide portions 131*a* and 131*d* through the optical couplers 131*b* and 131*e*, respectively. Also, the optical waveguide 3 extends from the first end facet 4*a* to the second end facet 4*b* of the semiconductor laser 1A, and the waveguide portions 131*a* and 131*d* constitute part of the optical waveguide 3. Thus, light output from the respective ring resonators to the optical waveguide 3 through the optical couplers propagate through the optical waveguide 3. The optical waveguide 3 is coupled to the input ports and the through ports of the optical couplers. In other words, the respective ring resonators in the first and second ring resonator regions 10*d* and 10*f* are connected in series by the optical waveguide 3.

A bending loss of the ring-like waveguide portion of a ring resonator increases as bend radii R decreases. However, with this configuration, reduction of the optical intensities of light output from the ring resonators due to the bending losses of the ring-like waveguide portions 131*c* and 131*f*, can be restricted. Thus, with the semiconductor laser 1A of this embodiment, even if ring resonators have smaller bend radii R, the relatively large optical intensity of light output from the ring resonators may be obtained. In other words, since the ring resonators with small bend radii R can be used, the optical path lengths of the ring-like waveguide portions 131*c* and 131*f* can be decreased. Also, by using the ring resonators with small bend radii R, the FSRs of the ring resonators can be increased. Thus, the FSRs of the ring resonators can be increased while increase of the optical losses of the ring resonators are restricted by using the ring resonators with small bend radii R.

Next, an example of a method for fabricating the semiconductor laser 1A will be described. First, a semiconductor layer, which becomes the optical waveguide layers 120 and 131, and a semiconductor layer, which becomes the diffraction grating layer 121 and the semiconductor layer 136, are grown on the semiconductor substrate 8 made of n-type InP by an epitaxial growth method such as a metal-organic chemical vapor deposition (MOCVD) method. Then, a diffraction grating pattern is drawn on a resist by exposure with electron beams. Then, etching is performed for the diffraction grating layer 121 by dry etching with the resist as a mask, so that the diffraction grating 121*a* is formed on the surface of the diffraction grating layer 121. The resist is removed, and then a p-type InP layer is grown on the diffraction grating 121*a* by the MOCVD method such that the diffraction grating 121*a* is embedded in the p-type InP layer. Then, the upper cladding layers 122 and 132 are formed.

Then, the semiconductor layers grown on regions, which becomes the gain region 10*a* and the amplifier region 10*c*, are removed by dry etching. Then, the optical waveguide layers 110, which include the lower optical confinement layers, the active layers having the multi quantum well (MQW) structure, and the upper optical confinement layers; and the upper cladding layers 112 are grown on the regions, from which the semiconductor layer is removed, by butt joining.

Then, a semiconductor layer, which becomes the contact layers 113, 123, and 133, is grown by the MOCVD method. Then, portions of the contact layers between regions on which the anode electrodes are formed are removed so that the anode electrodes are electrically isolated from each other.

Then, the regions corresponding to the first ring resonator region 10*d*, the phase adjustment region 10*e*, and the second ring resonator region 10*f* are covered with a mask. At the same time, the regions corresponding to the gain region 10*a*, the DBR region 10*b*, and the amplifier region 10*c* are covered with the mask such that only the portion corresponding to the optical waveguide 3 is remained. Etching is performed for the regions corresponding to the gain region 10*a*, the DBR region 10*b*, and the amplifier region 10*c* to a depth to reach the semiconductor substrate 8 by dry etching with the mask while the portion corresponding to the optical waveguide 3 is remained. Thus, the stripe-shaped mesa structure is formed. Then, both side surfaces of the mesa structure are buried by the semi-insulating region 102 made of Fe-doped InP by MOCVD method, and the mask is removed.

Then, the regions corresponding to the gain region 10*a*, the DBR region 10*b*, and the amplifier region 10*c* are covered with a mask. At the same time, the regions corresponding to the first ring resonator region 10*d*, the phase adjustment region 10*e*, and the second ring resonator region 10*f* are covered with the mask while the portion corresponding to the optical waveguide 3 is remained. Etching is performed for the regions corresponding to the first ring resonator region 10*d*, the phase adjustment region 10*e*, and the second ring resonator region 10*f* to a depth to reach the semiconductor substrate 8 by dry etching with the mask while the portion corresponding to the optical waveguide 3 is remained. Thus, the mesa structure is formed. Then, the insulating material such as $SiO_2$ is deposited on both side surfaces of the mesa structure by a chemical vapor deposition (CVD) method. Thus, the insulating film 13 is formed. Then, the BCB resin is formed on the insulating film 13 by spin-coating method, and the BCB resin is hardened. Thus, the resin layer 15 is formed, and then the mask is removed.

Then, the portions of the insulating films 13 and the resin layer 15 where the anode electrodes are arranged are removed. Then, the insulating film 11 composed of, for example, SiO$_2$ or SiN is deposited on the entire surfaces of the gain region 10a, the DBR region 10b, the amplifier region 10c, the first ring resonator region 10d, the phase adjustment region 10e, and the second ring resonator region 10f by the CVD method. Etching is performed for the portions of the insulating film 11 where the anode electrodes are arranged until the contact layer is exposed. The openings are formed. Then, the anode electrodes 114, 115, 124, 134, 135, and 138 are formed on the contact layer at the openings by liftoff process. At this time, wiring and electrode pads on the element are also formed. In addition, the thickness of the semiconductor substrate 8 is reduced to about 100 μm, for example, by polishing the back surface of the semiconductor substrate 8. Then, the cathode electrode 9 is evaporated on the back surface of the semiconductor substrate 8.

Finally, the semiconductor substrate 8 is cleaved in a bar-like shape, and hence a chip bar is formed. One cleaved facet of the chip bar is coated with the AR film 105, and the other facet is coated with the HR film 106. Then, a plurality of laser chips included in the chip bar are divided into individual laser chips. The divided laser chip is mounted on the cooling device 30. Accordingly, the semiconductor laser 1A is completed.

The semiconductor laser according to the present invention is not limited to the above described embodiment, and may be modified in various ways. For example, in the above embodiment, the semiconductor substrate and the respective semiconductor layers use the InP-based compound semiconductor. However, the configuration of the present invention can be preferably realized even with the other group III-V semiconductor such as a GaAs-based compound semiconductor. Also, in the above embodiment, the configuration of the optical waveguide uses the mesa structure. However, the optical waveguide may use the other configuration such as ridge type.

The principle of the present invention has been illustrated and described according to the preferable embodiment. However, the persons skilled in the art should recognize that the details of the embodiment can be modified without departing from the principle. Therefore, we claim the benefits obtained by all corrections and modifications made within the scope of the claims and the scope of the spirit of the present invention.

What is claimed is:

1. A semiconductor laser, comprising:
a gain region;
a distributed Bragg reflector region including a diffraction grating;
an end facet facing the distributed Bragg reflector region with the gain region arranged therebetween;
a first ring resonator including a first ring-like waveguide and a first optical coupler having a first input port and a first output port, the first output port including a through port and a cross port;
a second ring resonator including a second ring-like waveguide and a second optical coupler having second input port and a second output port, the second output port including a through port and a cross port; and
an optical waveguide that is optically coupled to the end facet and extending in a predetermined optical-axis direction, wherein
the first ring-like waveguide of the first ring resonator is optically coupled to the optical waveguide through the cross port of the first optical coupler,
the second ring-like waveguide of the second ring resonator is optically coupled to the optical waveguide through the cross port of the second optical coupler,
the through port of the first optical coupler of the first ring resonator and the through port of the second optical coupler of the second ring resonator are connected to each other in series by the optical waveguide,
the distributed Bragg reflector region, the gain region, and the end facet constitute a laser cavity,
the first, and second ring resonators have periodic transmittance peak wavelengths,
the first ring resonator has a free spectral range different from a free spectral range of the second ring resonator, and
at least one of the transmittance peak wavelengths of th second ring resonator is included in each transmission band of the transmittance peak wavelengths of the first ring resonator.

2. The semiconductor laser according to claim 1, wherein the optical waveguide is coupled to the first input port and the through port of the first output port, and
the optical waveguide is coupled to the second input port and the through port of the second output port.

3. The semiconductor laser according to claim 1, wherein the first and second optical couplers each have a splitting ratio smaller than 1, where the splitting ratio of the optical coupler is a ratio of an optical intensity at the through port to an optical intensity at the cross port.

4. The semiconductor laser according to claim 1, wherein the free spectral range of the first ring resonator is two or more times larger than the free spectral range of the second ring resonator.

5. The semiconductor laser according to claim 4, wherein the free spectral range of the first ring resonator is 2n times larger than the free spectral range of the second ring resonator when n is a natural number.

6. The semiconductor laser according to claim 5, wherein the first ring resonator has the transmittance peak wavelengths $\lambda_{P1}$,
the second ring resonator has the transmittance peak $\lambda_{P2}$, that is provided at a wavelength interval of 2n times the free spectral range of the second ring resonator, and
a difference $|\lambda_{P1}-\lambda_{P2}|$ between $\lambda_{P1}$ and $\lambda_{P2}$ is ½ or less of the free spectral range of the second ring resonator.

7. The semiconductor laser according to claim 1, wherein the first and second optical couplers are multimode interference couplers.

8. The semiconductor laser according to claim 1, further comprising a phase adjustment region that is arranged between the distributed Bragg reflector region and the end facet, the phase adjustment region adjusting an optical length of the optical waveguide.

9. The semiconductor laser according to claim 1, wherein the diffraction grating in the distributed Bragg reflector region is a chirp diffraction grating in which a period of the diffraction grating changes along the predetermined optical-axis direction.

10. The semiconductor laser according to claim 1, wherein the distributed Bragg reflector region includes a plurality of electrodes.

11. The semiconductor laser according to claim 1, wherein a high reflection film is formed on the end facet.

* * * * *